United States Patent
Baecker et al.

(10) Patent No.: US 7,330,744 B2
(45) Date of Patent: Feb. 12, 2008

(54) METAL SALT RESISTIVE LAYER ON AN SUPERCONDUCTING ELEMENT

(75) Inventors: Michael Baecker, Köln (DE); Joachim Bock, Erfstadt (DE)

(73) Assignee: Nexans (FR)

( * ) Notice: Subject to any disclaimer, the term of this patent is extended or adjusted under 35 U.S.C. 154(b) by 533 days.

(21) Appl. No.: 10/490,515

(22) PCT Filed: Nov. 14, 2001

(86) PCT No.: PCT/IB02/04715

§ 371 (c)(1), (2), (4) Date: Aug. 12, 2004

(87) PCT Pub. No.: WO03/043098

PCT Pub. Date: May 22, 2003

(65) Prior Publication Data

US 2004/0259737 A1  Dec. 23, 2004

(30) Foreign Application Priority Data

Nov. 14, 2001 (EP) ................................. 01402925

(51) Int. Cl.
*H01B 12/02* (2006.01)
*H01B 39/02* (2006.01)

(52) U.S. Cl. ................... 505/230; 505/231; 174/125.1
(58) Field of Classification Search .............. 505/230, 505/231, 236; 174/125.1
See application file for complete search history.

(56) References Cited

U.S. PATENT DOCUMENTS 5,015,623 A * 5/1991 Scholten .................... 505/329
6,365,554 B1 * 4/2002 Thompson et al. ......... 505/434

FOREIGN PATENT DOCUMENTS

| JP | 08-007675 | * | 1/1996 | |
| JP | 08007675 | | 1/1996 | ................... 12/10 |
| JP | 11-203958 | * | 7/1999 | |
| JP | 11203958 | | 7/1999 | ................... 12/12 |
| WO | 9813859 | | 4/1998 | |

* cited by examiner

*Primary Examiner*—Mark Kopec
(74) *Attorney, Agent, or Firm*—Sofer & Haroun, LLP

(57) ABSTRACT

The invention relates to a process for applying a resistive layer on an oxide superconducting element for electrically decoupling superconducting filaments contained in the element, an oxide superconducting element having a resistive layer and use thereof, in particular in ac applications, the resistive layer being formed by chemically converting the surface of a conducting metal coating sheating the superconducting core of said filaments into a salt of a metal constituting said conducting coating.

7 Claims, No Drawings

METAL SALT RESISTIVE LAYER ON AN SUPERCONDUCTING ELEMENT

RELATED APPLICATION

This application is a National Stage Application of PCT/IB02/04715 and claims the benefit of priority from European Patent Application No. 01 402 925.0, filed on Nov. 14, 2001, the entirety of which is incorporated herein by reference.

The present invention relates to a process for applying a resistive layer on an oxide superconducting element comprising at least one filament composed of a core of an oxide superconducting material sheathed in a conducting metal coating, such an oxide superconducting element having a resistive layer and the use thereof, in particular for ac applications.

Superconductivity is characterized by the complete loss of electrical resistivity. This is, however, valid for dc applications only. In ac applications which become increasingly interesting in recent years induced currents cause power losses (ac losses).

There are known metal oxide compounds having high critical temperature Tc of more than 77 K. Due to their high Tc these compounds are called high temperature superconducting materials (hts materials). A particular example for such metal oxide material is a superconductor of the bismuth-strontium-calcium-cup-rate type (BSCCO). Within this type there exist several high-Tc phases which differ in their number of copper oxide layers in the crystalline unit cell and show different critical temperatures Tc. There is e.g. known a phase of the composition $Bi_2Sr_2CaCu_2O_y$, having two layers and showing a Tc of 80 K (2212 phase) and a phase of the composition $Bi_2Sr_2Ca_2Cu_3O_y$, having three layers and showing a Tc as high as about 110 K (2223 phase).

For application such hts material is formed into elongated superconductors in the form of a wire or band, wherein a plurality of filaments composed of a core of said superconducting material sheathed in a conducting coating is bundled to one strand. For making such multifilament there is known the "powder in tube-technique" as described e.g. in WO 96/28853 or in WO 98/13859.

According to this technique a starting powder material or precursor material suitable for being transformed into a superconducting material and which in general has no or only to a very small extent the desired superconducting phase, is filled into a tube or embedded into a matrix, said tube or matrix consisting of a material having conventional conductivity, usually a metal.

The resulting structure is then subjected to a forming process including several forming steps such as drawing down and rolling and, according to need, including temperature treatment steps at elevated temperature, thereby forming filaments having a core of a superconducting (precursor) material sheathed in a coating or matrix of said conventionally conducting material. During said forming process any number of monofilaments can be assembled to a multifilament.

The thus obtained intermediate conductor material—in the form of a monofilament or multifilament—is then subjected to a final temperature treatment for converting the precursor material into the final superconducting phase or for optimizing the superconducting properties.

This temperature treatment is at least partially conducted in an oxygen containing atmosphere at elevated temperature. E.g. for the system (Bi, Pb) SCCO the temperature treatment can be carried out in air usually at a temperature between 835° C. and about 840° C. at reduced oxygen partial pressure as is disclosed e.g. in "Supercond. Sci. Technol.", Vol. 4, 1991, pages 165 to 171.

The resulting mono- and multifilaments, respectively, in the superconducting state or perform thereof are used for the preparation of multifilament conductors as disclosed e.g. in "IEEE Transactions on applied Superconductivity", Vol. 5, No. 2, June 1995, pages 1145 to 1149, for dc and ac applications.

However, it revealed that in ac applications such multifilament conductors generate rather high ac losses due to the electrically well conducting coating sheathing the filaments which impair the superconducting properties of the conductor.

By the conducting coating possible interruption of superconductivity between the crystallites of a single superconducting core of a filament can be bridged. However, the conducting coating shows not only low resistivity in the longitudinal direction but also in the cross direction between the different cores.

If such conductor is used for ac applications current eddies can be generated in which current flows in opposite directions in sections of different superconducting cores causing ac losses.

To overcome this problem and reduce the eddy-current in multifilament hts conductors the cross-section of said conductor must be reduced in which such eddies are induced.

The reduction of the cross-section can be achieved by providing layers (resistive layers) having an electrical resistivity higher than the conducting coating between the filaments thereby obtaining electrical decoupling of the filaments.

A suited material for the resistive layer must meet some essential requirements. Thus, it must allow diffusion of oxygen into the hts material or precursor material of the core during the final temperature treatment for the formation of superconducting phase. It must neither damage the conducting coating at the high temperatures required for the temperature treatment steps during the preparation of the filaments nor must it diffuse through the conducting coating causing pollution of the hts material by foreign material. Further, it must exhibit good adhesion to the filament, e.g. for not peeling off during the drawing down and rolling steps in the formation process of the filaments.

EP 0 977 281 discloses to provide a superconductor of the BSCCO type sheathed in a conducting coating made of silver or containing silver with a non conducting oxide material of the same type as the superconducting material based on Bi—Sr-Cuprate by drawing the filament through a melt of said non conducting Bi—Sr-Cuprate material. However, ceramic coatings as obtained by this process are brittle and likely to be damaged during subsequent working steps.

According to EP 0 977 281 A1 and WO 98/13859 a resistive metal oxide layer is coated onto the filaments by applying an oxidizable metal on the outer surface of the conducting layer, said oxidizable metal being oxidized to its non conducting oxide during the temperature and oxygen treatment to which the filaments for the preparation of a superconducting filament are subjected.

Further, in addition to the use of a non conducting metal oxide for the resistive layer, WO 98/13859 suggests the use of metal sulfide for the resistive coating. However, apart from the oxidation process for making the oxides as set out above no process is disclosed suitable for providing a filament with such sulfide coating nor is there any sulfide coated filament shown.

U.S. Pat. No. 6,110,873 discloses a non conducting ceramic coating as resistive layer obtained by applying a polymer mixture comprising the ceramic starting material suitable to be converted into the desired non conducting ceramic on the conducting coating by pressing, baking the resulting structure at a temperature sufficient for removing the polymer, said ceramic starting material being converted into its non conducting ceramic during the subsequent temperature and oxygen treatment of the filaments.

According to U.S. Pat. No. 6,110,873 the ceramic material is based on Bi2212 containing additionally Al, Mg or Ti.

JP 08007675 and JP 11203958 disclose superconducting elements, wherein a plurality of cores made of a superconducting oxide material is embedded in a metal matrix and the surface of the metal matrix is converted by sulfurization to a coating having a resistance which is higher than that of the metal of the matrix. According to JP 08007675 the metal of the matrix is silver which is converted to its sulfide.

However there is still a need for improved reduction of ac loss.

It was the object of the present invention to provide a process by which in a simple manner hts conductors can be provided having electrically decoupled superconducting elements comprising at least one filament composed of a core of a superconducting material or precursor thereof sheathed in a conducting coating wherein said element is provided with a resistive layer having a resistivity higher than the conducting coating, said resistive layer showing good adhesion to the outer surface of the conducting coating, does not impair the conducting layer and allows diffusion of oxygen into the core material but does not diffuse itself into the core impuring the core with foreign material.

Further, it was the object of the present invention to provide an oxide superconductor being advantageously suited for ac applications.

This object is solved by a process for providing an oxide superconducting element with a resistive layer, said oxide superconducting element comprising one filament composed of a core of an oxide superconducting material or of a precursor material which is convertable into said oxide superconducting material, and a conducting metal coating sheathing said core wherein a resistive layer is formed on the surface of the conducting metal coating by chemically converting at least part of the surface of the conducting metal coating into a salt of at least one of the metal components of the conducting metal coatings, said salt having a specific electrical resistivity which is higher than the specific electrical resistivity of the metal coating.

A multifilament oxide superconducting element comprising more than one filament can be assemblied to an oxide superconductor e.g. having the shape of a wire or band.

According to the present invention by providing each single filament with a separate resistance layer reduction of ac loss can be improved.

The oxide superconducting material as used for the core of the present invention consists or comprises at least one superconducting phase.

As used herein the term "precursor material" means any material that can be converted into the desired oxide superconducting material by heat treatment under suitable conditions such as oxides, salts or metals.

Preferably, the present invention relates to an oxide superconductor as obtainable according to the well-known powder-in-tube technique as illustrated above.

For the present invention, in principle, any kind of oxide superconducting material can be used for forming the cores. Examples are oxide superconducting material of the type (Y,SE)-(Ba,Ca,Sr)—Cu—O, (TI,SE)-Ea-Cu—O with Ea being alkaline-earth metal and SE being rare earth element, or an oxide superconducting material comprising Hg, such as rare earth-barium-cuprate type superconductors, e.g. mercury-barium-strontium-calcium-cuprate type superconductors, thallium-strontium-calcium-barium-cuprate type superconductors.

Preferably the superconducting material is of the bismuth-strontium-calcium-cuprate type such as the 2212 and most preferably the 2223 material, in particular wherein part of the bismuth is substituted by Pb (Pb—)Bi—Sr—Ca—Cu—O.

Further, the 2223 type material can additionally contain one or more other suitable elements or compounds such as e.g. sulfates of alkaline-earth metals, said sulfates having a high melting point, e.g. $BaSO_4$, $SrSO_4$ and/or $(Ba, Sr) SO_4$.

The conventionally conducting metal coating sheathing the core composed of a superconducting material or of a precursor thereof can be any kind of metal suited for the use in superconductors such as a noble metal. Usually the thickness of the metal layer is within a range of from about 0.05 mm to about 3 mm.

Preferably the metal for the coating is at least one selected from the group consisting of silver, copper, gold, palladium, platinum, rhodium, iridium, ruthenium, osmium and alloys thereof with each other, silver and silver alloys being particularly preferred.

According to the present invention a resistive layer is provided on the conducting metal coating by chemically converting the whole surface of said metal coating or part thereof into a non conducting salt. If the metal coating is composed of different metal components all of the components or only one or some of the different kinds of metal components can be converted into the desired salt.

Usually the thickness of said resistive layer is from about 13 μm to about 200 μm when applied. In the finished multifilament oxide superconducting element the thickness of this layer usually is from about 1 μm to about 10 μm.

The resistive layer can cover whole of the surface of the metal coating or only part thereof. In any case the coverage degree, i.e. the extent to which the surface is covered by the resistive layer, should be sufficient to suppress eddy-current and ac losses in a sufficient manner.

For the purpose of the present invention the conductivity of the resistive layer should be at least two orders at magnitude lower than at of the respective metal layer.

For the chemical conversion the surface can be treated with the respective acid which can be in gaseous form or in e.g. aqueous solution.

Generally, the surface of the conducting coating can be converted to any of its salts provided the salt can withstand the processing steps for the preparation of the final conductor.

Further, the thickness and the coverage degree of the salt layer must be sufficient to reduce ac losses in a suitable manner.

Preferably, the acid is an inorganic acid. For example the inorganic acid is at least one selected from the group consisting of hydrogen sulfide, hydrogen selenide, hydrogen telluride, sulfur acid and phosphoric acid. Consequently, the preferred salts to be formed are the sulfides, selenides, tellurides, sulfates and phosphates.

For the conversion the surface of the conducting coating can be contacted with the acid in its gaseous form, e.g. with gaseous hydrogen sulfide, or in liquid form e.g. in aqueous solution.

If the acid is used in solution such as an aqueous solution a suitable value for the concentration can range from about 0.1 mol/l to about 10 mol/l.

The intensity of the acid treatment and, thus, the thickness of the salt layer formed can be adjusted by the conditions of the treatment such as exposure time, concentration of the acid and temperature. Suitable treatment conditions can of course vary depending on, for example, the kind of metal material forming the conducting coating and the thickness desired for the resistive salt layer to be formed.

Sometimes it can be useful to support the conversion of the surface of the conducting coating material by applying electrical voltage to said coating, for example, if acids are used having only a weak oxidizing strength such as phosporic acid. In general suitable values for the voltage are ranging from about 0.5 to 5 volts. However depending on the specific material and of need the value can vary.

According to a further embodiment the conversion can be carried out in the presence of the metal salt to be formed. That is, for example, if the surface of the conducting coating is treated with sulfuric acid the respective sulfuric salt of a metal component of the conducting coating can be present in the solution of the acid. Preferably the salt is added in an amount resulting saturated concentration. If the filament to be treated is then removed from the solution a metal sulfate-sulfuric acid adduct crystallizes on the surface of the filament on cooling from which the sulfuric acid can be removed by a short thermal treatment resulting in a very adhesive sulfate layer.

Usually before being converted to its metal salts the surface of the conducting metal layer is cleaned, in particular degreased, by treatment with a suitable solvent. Solvents for degreasing are e.g. acetone and dichloromethane, etc.

In the following the temperature requirements for the salt to be formed are illustrated by way of a preferred embodiment wherein the conducting layer is composed of silver.

Usually the filaments are subjected to the acid treatment prior to the final heat treatment for converting the precursor material into the superconducting material, said heat treatment usually being carried out at a temperature of about 820° C.

During the heat treatment decomposition of the material forming the resistive layer should be avoided since during decomposition gas is formed in the element resulting in bubbles. Consequently the formed metal salt of the resistive layer must have a decomposition temperature which is higher than the temperature applied for heat treatment.

For example in case of a conducting silver coating the Ag salt to be formed on the surface of the conducting coating must have a decomposition temperature of above 820° C., that is a decomposition temperature higher than the temperature applied for heat treatment. Silver salts meeting this requirement are silver sulfide (decomposition at 842° C.), silver selenide (decomposition about 880° C.) and silver phosphate (decomposition above 850° C. according to CRC Handbook of Chemistry and Physics, 70$^{th}$ edition).

However since the above conditions of the heat treatment are referred only to atmospheric conditions but not to the conditions existing in the intermediate layers of a silver matrix and at reduced pressure a salt having a lower decomposition temperature or melting point can be also suitable for the resistive layer provided that decomposition and thus formation of bubbles are avoided. Thus, silver sulfate though melting already at 656° C. can be used also as suitable resisitive layer under such conditions.

Hts conducting elements of the present invention comprising a resistive layer formed by chemically converting metal components of the surface of the conducting coating into their non conducting metal salt thereby forming the resistive layer are advantageous in that no foreign metal is present in the resistive layer; the resistive layer is readily obtainable by direct conversion of the surface of the conducting metal coating; the layer obtained by conversion of the surface metals of the conducting coating show very good adhesion; the thickness of the obtained resistive layer is very homogeneous allowing very thin layers to be formed; due to the strong adhesion improved forming properties are obtained; the layer thickness can be readily adjusted by simple variation of the reaction time during which the acids act on the surface of the conducting coating; no or only very slight diffusion of the anions through the conducting coating into the superconducting material occurs due to the large ion radius of the anions compared to the radius of oxygen, and there is no or only slight hindrance of the oxygen diffusion through the conducting coating into the superconducting material due to the very thin layers obtainable by the present process.

Due to their advantageous properties as set out above the superconducting elements of the present invention are suitable for ac applications. Examples for preferred ac application are such as in the preparation of cables, magnets, magnetic bearings, coils, transformers, electric motors, SMES (Superconductuing magnetic energy storage), current limiters and current supplies.

In the following the present invention is further illustrated by way of specific examples. In the examples the filaments used had a core of 2223-material. Further the thickness of the Ag layer, the conducting metal layer of the monofilaments used in the following examples, was from about 200 µm to about 500 µm.

EXAMPLE 1

Some monofilaments having a conducting coating of silver were put into a quartz tube after cleaning of the surface and exposed to a flow of gaseous $H_2S$ for one hour at room temperature. After this time on the surface of the monofilaments a continuous $Ag_2S$ layer was formed having a thickness of 3 µm.

In case of heating of the tube to a temperature of 200° C. an increased layer thickness of 6 µm was obtained.

The obtained layers adhered very strongly to the monofilaments such that a metal tool was necessary for removing.

EXAMPLE 2

Some monofilaments having a conducting coating of silver were put, after cleaning of the surfaces, into a quartz tube filled with water through which gaseous $H_2S$ flew from the bottom to the top by a glass fritt as diffuser. The resulting thickness of the formed $Ag_2S$ layer was about 9 µm.

EXAMPLE 3

Several monofilaments were emerged into a vessel with boiling phosphoric acid of a concentration of 10 mol/l. On the conducting coating a layer of ortho-silver phosphate was formed having a thickness of about 10 µm.

EXAMPLE 4

To a monofilament having a conducting coating of silver a voltage of 1 to 2 V was applied and the monofilament was emerged into phosphoric acid of a concentration of 10 mol/l at room temperature.

EXAMPLE 5

Several monofilaments (having a conducting coating of silver) were emerged into a vessel with boiling sulfuric acid for 20 minutes after their surfaces had been cleaned. Additionally, to the boiling sulfuric acid silver sulfate was added until saturation was reached. The non oxidizing sulfuric acid affected the surface of the silver coating only slightly resulting in a layer of silver sulfate having a thickness of about 1 µm. Due to the saturation concentration of the silver sulfate a silversulfate-sulfuric acid adduct crystallized on the surface of the monofilaments when the monofilaments were taken out from the vessel on cooling.

Subsequently the monofilaments having crystallized silversulfate-sulfuric acid adduct on their surfaces were subjected to a short heat treatment 250° C. of a duration between from 10 min. to 20 hours thereby removing the sulfuric acid resulting in a strongly adhering resistive layer of silver sulfate having a thickness of about 10 µm.

The invention claimed is:

1. Oxide superconducting element having one filament, said element comprising:
   a core of an oxide superconducting material or of a precursor material which is convertible into said oxide superconducting material; and
   a conducting metal coating sheathing said core, wherein a resistive layer of at least one salt of at least one of the metal components of the metal coating having a specific electrical resistivity which is higher than the specific electrical resistivity of the metal coating is applied on at least part of the surface of the conducting metal coating, wherein the thickness of said resistive layer is at least 1 micrometer.

2. Oxide superconducting element according to claim 1, wherein the conducting metal coating is composed of at least one metal selected from the group consisting of silver, copper, gold, palladium, platinum, rhodium, iridium, ruthenium, osmium, and alloys thereof with each other.

3. Oxide superconducting element according to claim 2, wherein the conducting metal coating is composed of silver or a silver alloy.

4. Oxide superconducting element according to claim 1, wherein the metal salt is at least one selected from the group consisting of a sulfate, sulfide, selenide, telluride and phosphate.

5. Oxide superconducting element according to claim 4, wherein at least part of the surface of the conducting metal coating is covered by a resistive layer of silver sulfide.

6. Oxide superconducting element according to claims 1, wherein the superconducting material is of the Bi—Sr—Ca—Cu—O type.

7. Oxide superconducting element according to claim 1, in the form of a wire or band comprising a plurality of filaments.

* * * * *